United States Patent
Hiyoshi et al.

[11] Patent Number: 5,866,944
[45] Date of Patent: *Feb. 2, 1999

[54] MULTICHIP PRESS-CONTACT TYPE SEMICONDUCTOR DEVICE

[75] Inventors: Michiaki Hiyoshi; Takashi Fujiwara; Hideo Matsuda, all of Yokohama, Japan

[73] Assignee: Kabushiki Kaisha Toshiba, Kawasaki, Japan

[ * ] Notice: The term of this patent shall not extend beyond the expiration date of Pat. No. 5,610,439.

[21] Appl. No.: 665,980

[22] Filed: Jun. 19, 1996

[30] Foreign Application Priority Data

Jun. 20, 1995 [JP] Japan ................................. 7-153384

[51] Int. Cl.$^6$ .......................... H01L 29/74; H01L 23/48; H01L 23/16
[52] U.S. Cl. .......................... 257/719; 257/727; 257/178; 257/181; 257/182; 257/718; 257/688; 257/785
[58] Field of Search ................................. 257/719, 727, 257/726, 633, 177–179, 181, 182, 161, 730, 723, 718, 688, 788, 785

[56] References Cited

U.S. PATENT DOCUMENTS

| | | | |
|---|---|---|---|
| 4,918,514 | 4/1990 | Malsnda et al. | 257/182 |
| 4,958,215 | 9/1990 | Kojima et al. | 257/182 |
| 4,996,586 | 2/1991 | Matsuda et al. | 257/726 |
| 5,140,406 | 8/1992 | Matsuda et al. | 257/730 |
| 5,221,851 | 6/1993 | Gobrecht et al. | 257/693 |
| 5,250,821 | 10/1993 | Ferla et al. | 257/177 |
| 5,360,984 | 11/1994 | Kirihata | 257/161 |
| 5,360,985 | 11/1994 | Hiyoshi et al. | 257/181 |
| 5,459,356 | 10/1995 | Schulze et al. | 257/773 |
| 5,469,103 | 11/1995 | Shigekane | 257/471 |

*Primary Examiner*—Wael Fahmy
*Assistant Examiner*—Alexander Oscar Williams
*Attorney, Agent, or Firm*—Oblon, Spivak, McClelland, Maier & Neustadt, P.C.

[57] ABSTRACT

In the present invention, by virtue of heat buffer plates respectively located on the major surfaces of IGBT chips and FRD chips arranged in a single plane, the total thickness of each chip and a corresponding one of the heat can be set to a substantially predetermined value. A thickness-correcting member having elongated projections corresponding to the chips is provided on those surfaces of the heat buffer plates which is remote from the chips. A heat buffer disk plate is provided on those surfaces of the chips which are opposite to the major surfaces thereof. The thickness-correcting member, the heat buffer plates and the IGBT and FRD chips are held and simultaneously pressed between an emitter press-contact electrode plate and a collector press-contact electrode plate. Before using the device, a force of press, which is higher than that applied at the time of using the device and can plastically deform the thickness-correcting member, is applied to the emitter press-contact electrode plate and the collector press-contact electrode plate, thereby correcting variations in total thickness of each semiconductor chip and a corresponding one of the heat buffer plates.

60 Claims, 7 Drawing Sheets

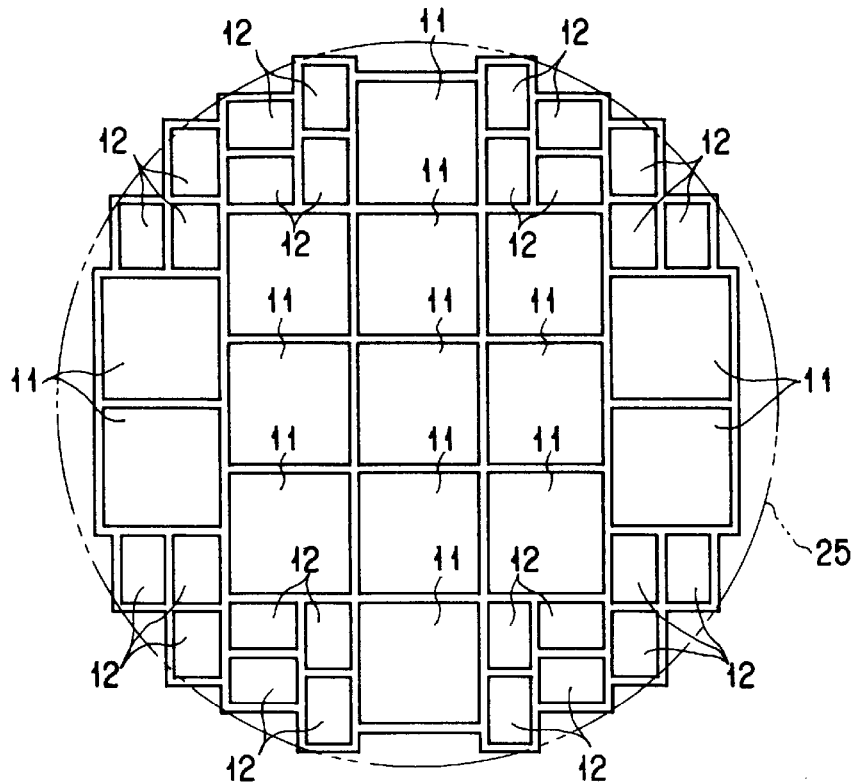
F I G. 2
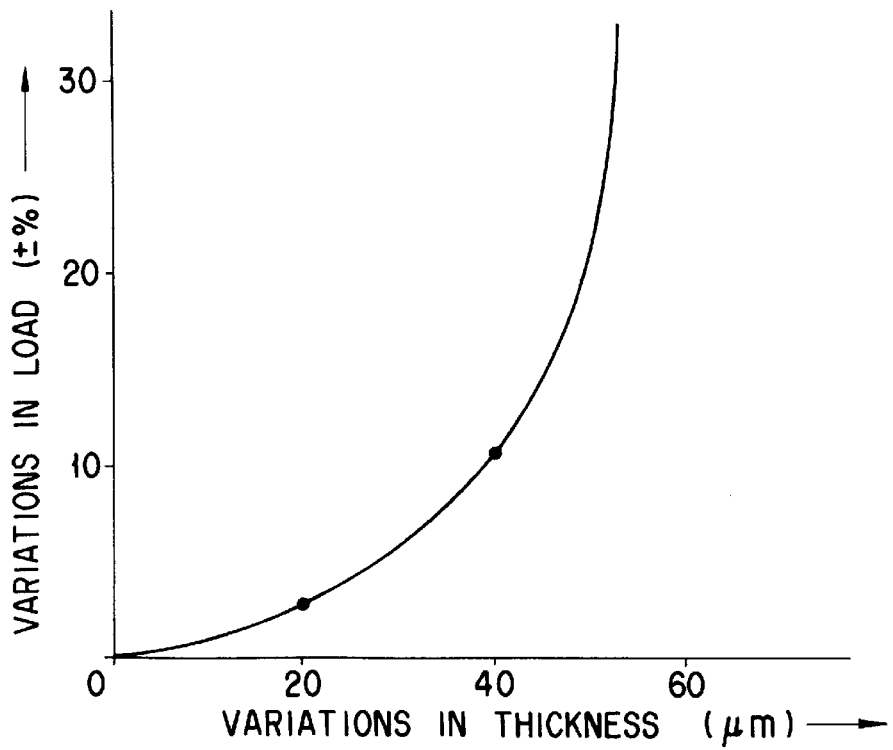
F I G. 3

5,866,944

MULTICHIP PRESS-CONTACT TYPE SEMICONDUCTOR DEVICE

BACKGROUND OF THE INVENTION

1. Field of the Invention

The present invention relates to a multichip press-contact type semiconductor device, which is used in a state where a plurality of semiconductor chips press-contact each other.

2. Description of the Related Art

A press-contact type semiconductor is broadly known which has a structure in which a single semiconductor chip is held between press-contact electrode plates. Such a press-contact type semiconductor device is described, for example, in U.S. Pat. No. 4,996,586 (Matsuda et al.) "CRIMP-TYPE SEMICONDUCTOR DEVICE HAVING NON-ALLOY STRUCTURE."

However, in the above-mentioned conventional press-contact type semiconductor device, the chip size must be enlarged in order to increase the rated current. Therefore, it is highly possible that defects, which are impossible to recover, will occur as the driving ability is increased, and hence that the manufacturing yield will decrease.

SUMMARY OF THE INVENTION

It is a first object of the present invention to provide a press-contact type semiconductor device which can easily enhance its driving ability and contribute to increasing the manufacturing yield.

It is a second object of the present invention to provide a press-contact type semiconductor device which enables a uniform and optimal load to be applied to each semiconductor chip at the time of simultaneously pressing a plurality of semiconductor chips.

It is a third object of the present invention to provide a press-contact type semiconductor device which enables a uniform and optimal load to be applied to each semiconductor chip at the time of simultaneously pressing a plurality of semiconductor chips of different types and thicknesses.

To attain the above-described first through third objects, there is provided a press-contact type semiconductor device comprising: a plurality of semiconductor chips located in a single plane and having different thicknesses; a plurality of heat buffer plates located on major surfaces of the semiconductor chips, respectively, the total thickness of one of the heat buffer plates and that one of the semiconductor chips which corresponds to the one heat buffer plate being set substantially the same as the total thickness of any other heat buffer plate and that one of the semiconductor chips which corresponds to the any other heat buffer plate; a first press-contact electrode plate having elongated projections extending from surface portions thereof corresponding to the semiconductor chips, to the heat buffer plates, respectively; a heat buffer disk plate located on those surfaces of the semiconductor chips which are opposite to the major surfaces; and a second press-contact electrode plate located on that surface of the heat buffer disk plate which is remote from the semiconductor chips; wherein the first and second press-contact electrode plates are pressed such that the heat buffer plates, the semiconductor chips and the heat buffer disk plate interposed therebetween are brought into press contact with each other, thereby correcting variations in thickness among the semiconductor chips by means of the heat buffer plates.

In the above-described structure in which a plurality of semiconductor chips press-contact each other, the rated current can be increased only by increasing the number of the chips, which means that the driving ability can easily be increased. Moreover, it suffices if a multiple of semiconductor chips of a small size are produced, and only those of good quality are selected therefrom. Therefore, the manufacturing yield can be enhanced. In addition, since, in the case of bringing semiconductor chips of different thicknesses (or semiconductor chips of different types and thicknesses) into press contact with each other, the heat buffer plates correct variations in thickness among the semiconductor chips, a uniform and optimal load can be applied to each semiconductor chip when the first and second press-contact electrode plates are pressed.

Further, to attain the above-described first through third objects, there is provided a press-contact type semiconductor device comprising: a plurality of semiconductor chips located in a single plane; a plurality of heat buffer plates located on major surfaces of the semiconductor chips, respectively; a thickness-correcting member having elongated projections extending from surface portions thereof corresponding to the semiconductor chips, to the major surfaces of the semiconductor chips, respectively; a heat buffer disk plate located on those surfaces of the semiconductor chips which are opposite to the major surfaces; and first and second press-contact electrode plates, to which a force of press is applied such that the thickness-correcting member, the heat buffer plates, the semiconductor chips and the heat buffer disk plate, which are interposed between the electrode plates, are brought into press contact with each other; wherein the thickness-correcting member has its elongated projections deformed when a force of press, which is higher than that applied at the time of using the device and can plastically deform the thickness-correcting member, is applied to the first and second press-contact electrode plates, thereby correcting variations in the total thickness of each semiconductor chip and a corresponding one of the heat buffer plates.

In the above-described structure in which a plurality of semiconductor chips press-contact each other, the rated current can be increased only by increasing the number of the chips, which means that the driving ability can easily be increased. Moreover, it suffices if a multiple of semiconductor chips of a small size are produced, and only those of good quality are selected therefrom. Therefore, the manufacturing yield can be enhanced. In addition, since in the case of bringing semiconductor chips into press contact with each other, variations in the total thickness of each semiconductor chip and a corresponding heat buffer plate can be corrected by plastically deforming the elongated projections of the thickness-correcting member, a uniform and optimal load can be applied to each semiconductor chip when the first and second press-contact electrode plates are pressed.

Moreover, to attain the above-described first through third objects, there is provided a press-contact type semiconductor device comprising: a plurality of semiconductor chips located in a single plane and having different thicknesses; a plurality of heat buffer plates located on major surfaces of the semiconductor chips, respectively, the total thickness of one of the heat buffer plates and that one of the semiconductor chips which corresponds to the one heat buffer plate being set substantially the same as the total thickness of any other heat buffer plate and that one of the semiconductor chips which corresponds to the any other heat buffer plate; a thickness-correcting member located on the heat buffer plates and having elongated projections projecting from surface portions thereof corresponding to the semiconductor chips toward the semiconductor chips, respectively; a heat buffer disk plate located on those surfaces of the semiconductor chips which are opposite to the major surfaces; and first and second press-contact electrode plates, to which a force of press is applied such that the thickness-correcting member, the heat buffer plates, the semiconductor chips and the heat buffer disk plate, which are interposed between the electrode plates, are brought into press contact with each other; wherein variations in thickness among the semiconductor chips are corrected by the heat buffer plates, and the thickness-correcting member has its elongated projections deformed when a force of press, which is higher than that applied at the time of using the device and can plastically deform the thickness-correcting member, is applied to the first and second press-contact electrode plates, thereby correcting variations in total thickness of each semiconductor chip and a corresponding one of the heat buffer plates.

In the above-described structure in which a plurality of semiconductor chips press-contact each other, the rated current can be increased only by increasing the number of the chips, which means that the driving ability can easily be increased. Moreover, it suffices if a multiple of semiconductor chips of a small size are produced, and only those of good quality are selected therefrom. Therefore, the manufacturing yield can be enhanced. In addition, in the case of bringing semiconductor chips of different thicknesses (or semiconductor chips of different types and thicknesses) into press contact with each other, variations in thickness among the semiconductor chips can be corrected by the heat buffer plates, and variations in total thickness of each chip and a corresponding heat buffer plate can be corrected by plastically deforming the elongated projections of the thickness-correcting member. Accordingly, a uniform and optimal load can be applied to each semiconductor chip when the first and second press-contact electrode plates are pressed.

To attain the above-described first through third objects, there is provided a press-contact type semiconductor device comprising: a plurality of semiconductor chips located in a single plane; a thickness-correcting member having elongated projections extending from surface portions thereof corresponding to the semiconductor chips, to the major surfaces of the semiconductor chips, respectively; a heat buffer disk plate located on those surfaces of the semiconductor chips which are opposite to the major surfaces; and first and second press-contact electrode plates, to which a force of press is applied such that the thickness-correcting member, the semiconductor chips and the heat buffer disk plate, which are interposed between the electrode plates, are brought into press contact with each other; wherein the thickness-correcting member has its elongated projections deformed when a force of press, which is higher than that applied at the time of using the device and can plastically deform the thickness-correcting member, is applied to the first and second press-contact electrode plates, thereby correcting variations in thickness among the semiconductor chips.

In the above-described structure in which a plurality of semiconductor chips press-contact each other, the rated current can be increased only by increasing the number of the chips, which means that the driving ability can easily be increased. Moreover, it suffices if a multiple of semiconductor chips of a small size are produced, and only those of good quality are selected therefrom. Therefore, the manufacturing yield can be enhanced. In addition, since in the case of bringing semiconductor chips into press contact with each other, variations in thickness among the semiconductor chips can be corrected by plastically deforming the elongated projections of the thickness-correcting member, a uniform and optimal load can be applied to each semiconductor chip when the first and second press-contact electrode plates are pressed.

Furthermore, to attain the above-described first through third objects, there is provided a press-contact type semiconductor device comprising: a plurality of semiconductor chips located in a single plane; a plurality of heat buffer plates located on major surfaces of the semiconductor chips, respectively; a thickness-correcting member located on the heat buffer plates for correcting variations in total thickness of each of the semiconductor chips and a corresponding one of the heat buffer plates; a heat buffer disk plate located on those surfaces of the semiconductor chips which are opposite to the major surfaces; and first and second press-contact electrode plates, to which a force of press is applied such that the thickness-correcting member, the heat buffer plates, the semiconductor chips and the heat buffer disk plate, which are interposed between the electrode plates, are brought into press contact with each other; wherein the thickness-correcting member is deformed when a force of press, which is higher than that applied at the time of using the device and can plastically deform the thickness-correcting member, is applied to the first and second press-contact electrode plates, thereby correcting the variations in total thickness of each semiconductor chip and a corresponding one of the heat buffer plates.

In the above-described structure in which a plurality of semiconductor chips press-contact each other, the rated current can be increased only by increasing the number of the chips, which means that the driving ability can easily be increased. Moreover, it suffices if a multiple of semiconductor chips of a small size are produced, and only those of good quality are selected therefrom. Therefore, the manufacturing yield can be enhanced. In addition, since in the case of bringing semiconductor chips into press contact with each other, variations in total thickness of each semiconductor chip and a corresponding heat buffer plate can be corrected by plastically deforming the elongated projections of the thickness-correcting member, a uniform and optimal load can be applied to each semiconductor chip when the first and second press-contact electrode plates are pressed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 2 is a plan view, useful in explaining the arrangement of semiconductor chips employed in the device of FIG. 1;

FIG. 3 is a graph, showing the relationship between variations in thickness and variations in load;

DETAILED DESCRIPTION OF THE PREFERRED EMBODIMENTS

Figure 1:
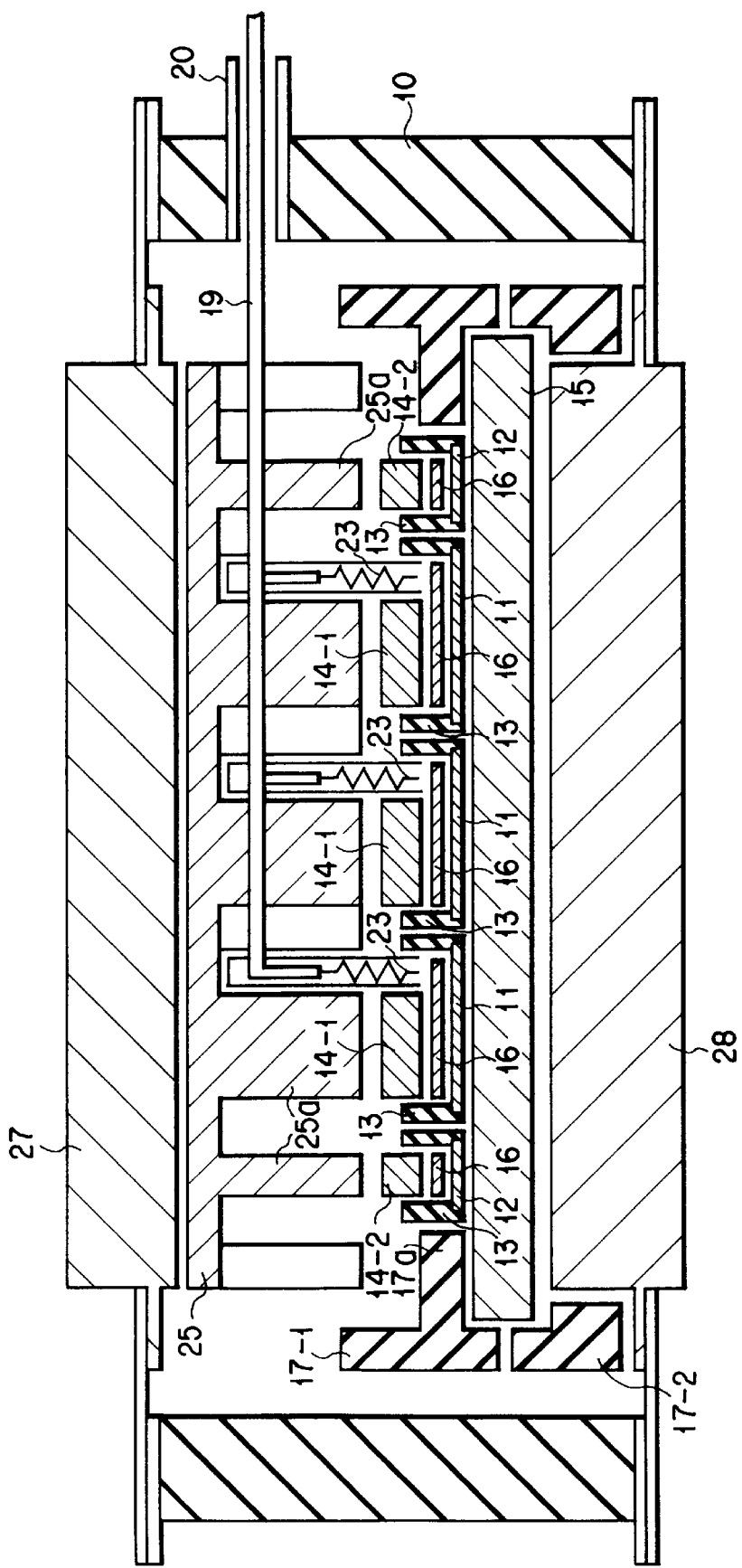
FIG. 1 is a cross sectional view of a press-contact type semiconductor device according to a first embodiment of the invention.

FIG. 1 is a cross sectional view, showing a press-contact type semiconductor device according to a first embodiment of the invention. In the first embodiment, a plurality of press-contact type IGBT (Insulating Gate Bipolar Transistor) chips and a plurality of FRD (Fast Recovery Diode) chips are pressed, such that the IGBT chips are connected parallel to the FRD chips and the current-flow direction of the IGBT chips is opposite to that of the FRD chips, thereby constituting a multichip reverse-conduction press-contact type IGBT device.

IGBT chips 11, FRD chips 12, chip frames 13, emitter-side heat buffer plates 14-1 and 14-2, a collector-side heat buffer disk plate 15, soft-metal foil members 16, ring frames 17-1 and 17-2, gate leads 19, gate press-contact electrodes 23 and a thickness-correcting member 25 are sealed in an envelope 10 formed, for example, of ceramic between an emitter press-contact electrode plate 27 and a collector press-contact electrode plate 28.

Each of the chip frames 13 fixes the four sides of a corresponding one of the chips 11 and 12, thereby fixing and positioning them horizontally. The chip frames 13 are made of silicone resin, polyetherimide, etc., and secured to the chips 11 and 12 by means of an adhesive, etc. Further, the heat buffer plates 14-1 and 14-2 are formed, for example, of molybdenum plates with a thickness of 1–2 mm, and contact the major surfaces of the IGBT chips 11 and the FRD chips 12 in the chip frames 13, respectively. The heat buffer plates 14-1 located above the IGBT chips 11 have a thickness differing from that of the heat buffer plates 14-2 located above the FRD chips 12. The sum of the thickness of the IGBT chip 11 and that of the heat buffer plate 14-1 is set equal to the sum of the thickness of the FRD chip 12 and that of the heat buffer plate 14-2. The reason for this is that it is necessary to make the IGBT chip 11 and the FRD chip 12 have different thicknesses in order to obtain optimal characteristics of the chips. Further, to prevent concentration of load on the corners of the chips 11 and 12, each corner of the heat buffer plates 14-1 and 14-2 has a radius of curvature of 0.2–1 mm.

The heat buffer disk plate 15 is placed on the reverse surfaces of the chips 11 and 12. The soft-metal foil members 16 are made of Cu, etc., and interposed between the chips 11 and 12 and the heat buffer plates 14-1 and 14-2, respectively, so as to realize excellent electrical contact therebetween. The ring frames 17-1 and 17-2 are formed of an insulator such as a resin. The ring frame 17-1 has a frame 17a projecting toward the inside and facilitating the positioning of the chips 11 and 12. The heat buffer disk plate 15 is held between the ring frames 17-1 and 17-2, and the chips 11 and 12 are positioned by the frame 17a.

A metal sleeve 20 is provided for leading the envelope 10 to the outside. The gate press-contact electrodes 23 are provided at locations corresponding to the gate electrodes of the IGBT chips 11, and are urged against the gate electrodes of the chips 11 by means of a spring. A control signal for controlling each IGBT chip 11 is supplied to the gate electrode of the chip 11 via the gate lead 19 and a corresponding one of the gate press-contact electrodes 23.

At the time of using the device, a press force, for example, of about 10 MPa is applied from the outside of the device to the outer surfaces of the emitter press-contact electrode plate 27 and the collector press-contact electrode plate 28, thereby bringing the elements, held between the plates, into press contact with each other. The thickness-correcting member 25 is interposed between the emitter press-contact electrode plate 27 and the heat buffer plates 14-1 and 14-2, and has column-shaped projections 25a which project corresponding to the IGBT chips 11 and the FRD chips 12 and press-contact the major surfaces of the chips 11 and 12.

Before using the device, a press force higher than that applied at the time of using the same is applied to the outer surfaces of the emitter press-contact electrode plate 27 and the collector press-contact electrode plate 28, thereby deforming the projections 25a of the thickness-correcting member 25 and thus correcting variations in thickness concerning the heat buffer plates and the chips. If a fully-annealed member made of oxygen-free copper and having a thickness of 15 mm is used as the correcting member 25, a press force of about 15 MPa is applied to the outer surfaces of the press-contact electrode plates 27 and 28. As a result, each of the projections 25a of the correcting member 25 plastically deforms to a degree depending upon the total thickness of corresponding heat buffer plate (14-1, 14-2) and chip (11, 12). In other words, the greater the total thickness of corresponding heat buffer plate and chip, the greater the deformation (compression) of a corresponding projection 25a. The maximum plastic deformation is about 0.2%.

The total amount of deformation of the thickness-correcting member 25 depends upon the material and thickness of the member 25, a press force applied thereto, etc. If the press force is predetermined, the thickness of the member 25 is set in accordance with a required amount of deformation.

FIG. 2 is a plan view, showing the arrangement of the chips 11 and 12 employed in the FIG. 1 device. As is shown in FIG. 2, fifteen IGBT chips 11 are arranged in a center portion, and twenty eight FRD chips 12 are arranged around the chips 11. The FRD chips 12 are connected parallel to the IGBT chips 11 such that the current-flow direction of the FRD chips is opposite to that of the IGBT chips. Each IGBT chip 11 has a press-contact portion with a size of 11.2 mm×11.2 mm, and an appropriate press force for each chip is 80–120 Kg. The two-dot chain line 25 indicates that side of the thickness-correcting member which faces the chips 11 and 12. On this side of the member 25, there are provided elongaged projections respectively corresponding to the chips.

FIG. 3 shows the relationship between variations in total thickness of each chip and that of a corresponding heat buffer plate, and variations in load among chips. In the FIG. 3 case, no thickness-correcting member 25 is used. As is evident from FIG. 3, when variations in total thickness fall within a range of 40 μm or less, variations in load fall within a range of ±10%. On the other hand, when the range of variations in total thickness exceeds 40 μm, the range of variations in load significantly increases. Accordingly, it is preferable that the difference between the total thickness of each IBGT chip 11 and a corresponding heat buffer plate 14-1 and the total thickness of each FRD chip 12 and a corresponding heat buffer plate 14-2 is smaller than 40 μm.

Figure 4:
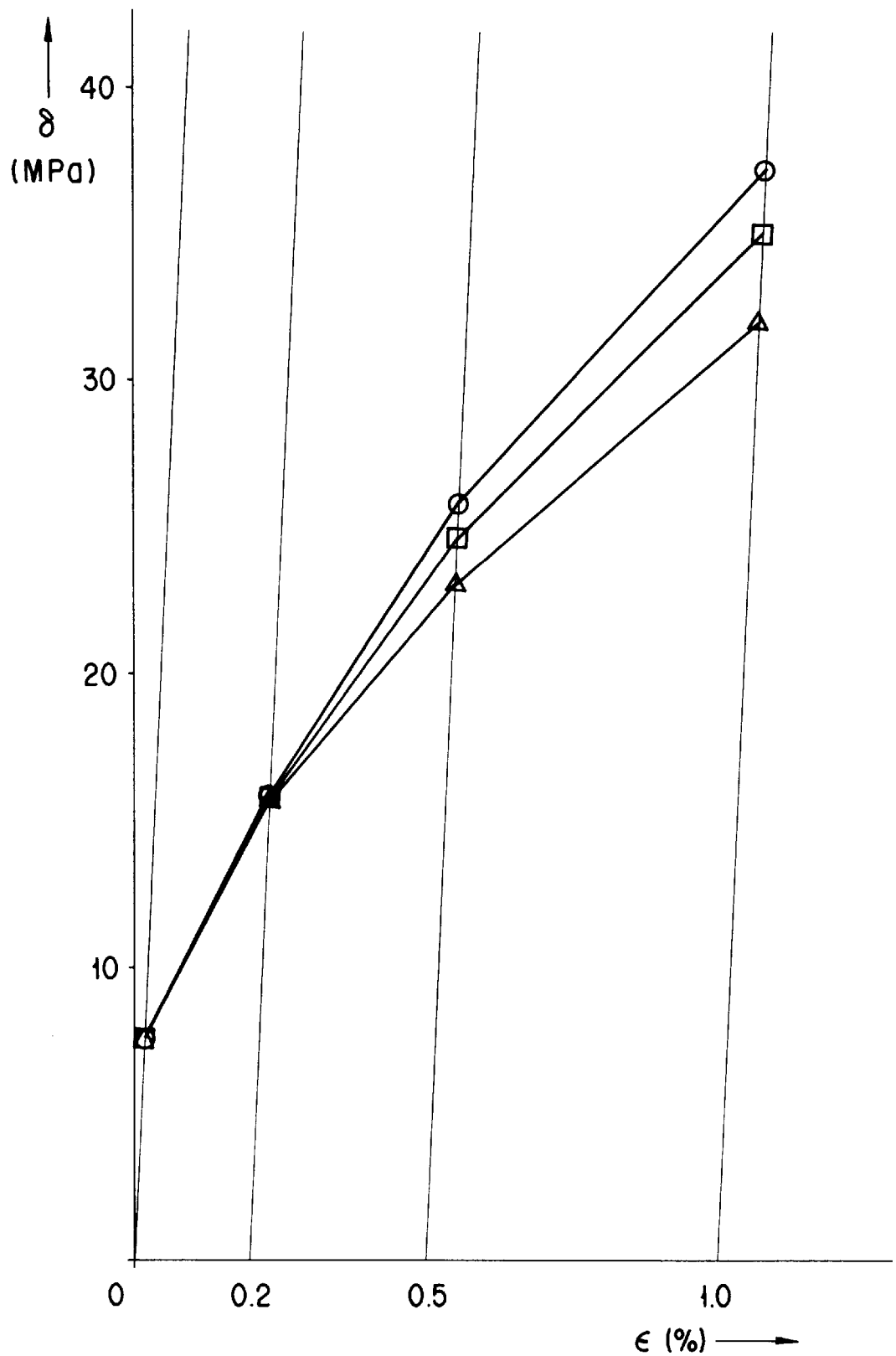
FIG. 4 is a graph, showing the relationship between the degree of deformation of a thickness-correcting member and the force of press applied thereto.

FIG. 4 shows the relationship between the amount of deformation, ε (%), of the thickness-correcting member 25 and a pressure, σ (MPa), applied thereto. The experimental results were obtained at a room temperature, using fully annealed oxygen-free copper as the material of the member 25. As is shown in FIG. 4, the amount of plastic deformation occurring when a pressure of about 15 MPa is applied is about 0.2%, which means that if the member 25 has a thickness of 15 mm, it deforms by about 30 μm. Accordingly, if variations in total thickness of each chip and a corresponding heat buffer plate fall within a range of about 30 μm or less, variations in pressure due to variations in thickness can sufficiently be compensated. Further, even if the variations in thickness is not completely compensated, it suffices if they fall within the range of 40 μm or less, as mentioned above. If variations in total thickness of each chip and a corresponding buffer plate fall within a range of 40 to 70 μm, they can be considered equivalent to the case where they fall within a range of 10 to 40 μm, since the thickness of the member 25 is reduced by 30 μm as a result of deformation. Thus, variations in load among chips can be restrained to several %–10% which is sufficiently tolerable in actual use.

In the above-described structure in which a plurality of IGBT chips 11 and FRD chips 12 press-contact each other, the rated current can be increased only by increasing the number of the IGBT chips 11 and the FRD chips 12, which means that the driving ability can easily be increased. Moreover, it suffices if a multiple of IGBT chips 11 and FRD chips 12 of a small size are produced, and only those of good quality are selected therefrom. Therefore, the manufacturing yield can be enhanced.

In a multichip type press-contact semiconductor device produced by simultaneously pressing a plurality of semiconductor chips, it is considered inevitable that a heavier load is applied to the combination of a certain chip and a corresponding heat buffer plate, than a load applied to that combination of another chip and a corresponding buffer plate, which is thinner than the first-mentioned combination. In general, in the press-contact type semiconductor device, there is an optimal load to be applied to a chip, which depends upon the area of the chip. If an excessive load is applied to a chip, a great stress occurs within the chip, thereby degrading the resistance of the chip against the TFT (Thermal Fatigue Test), etc. On the other hand, a deficient load on the chip will result in an increase in thermal resistance or on-voltage.

In the first embodiment, however, the thicknesses of chips depending upon the types of elements incorporated therein are corrected by providing heat buffer plates of different thicknesses. Therefore, when a pressure is applied to the emitter and collector press-contact electrode plates 27 and 28, a uniform and optimal load is applied to the semiconductor chips 11 and 12 of different thicknesses. As a result, the reliability of the device is enhanced, and an increase in thermal resistance or on-voltage is prevented.

In addition, even where chips are designed to have the same thickness, variations in thickness may well occur during manufacturing. Variations in the thickness of each chip and each heat buffer plate due to the manufacturing variations are corrected by means of the above-described thickness-correcting member 25. Thus, also in this case, a uniform and optimal load can be applied to the chips 11 and 12.

If the chips 11 and 12 have substantially the same thickness, or if the thickness variations of the chips fall within a small range and can be corrected only by the thickness-correcting member 25, it is a matter of course that variations in total thickness of each chip and a corresponding heat buffer plate may be corrected only by the correcting member 25, with the same thickness imparted to the heat buffer plates 14-1 and 14-2.

Figure 5:
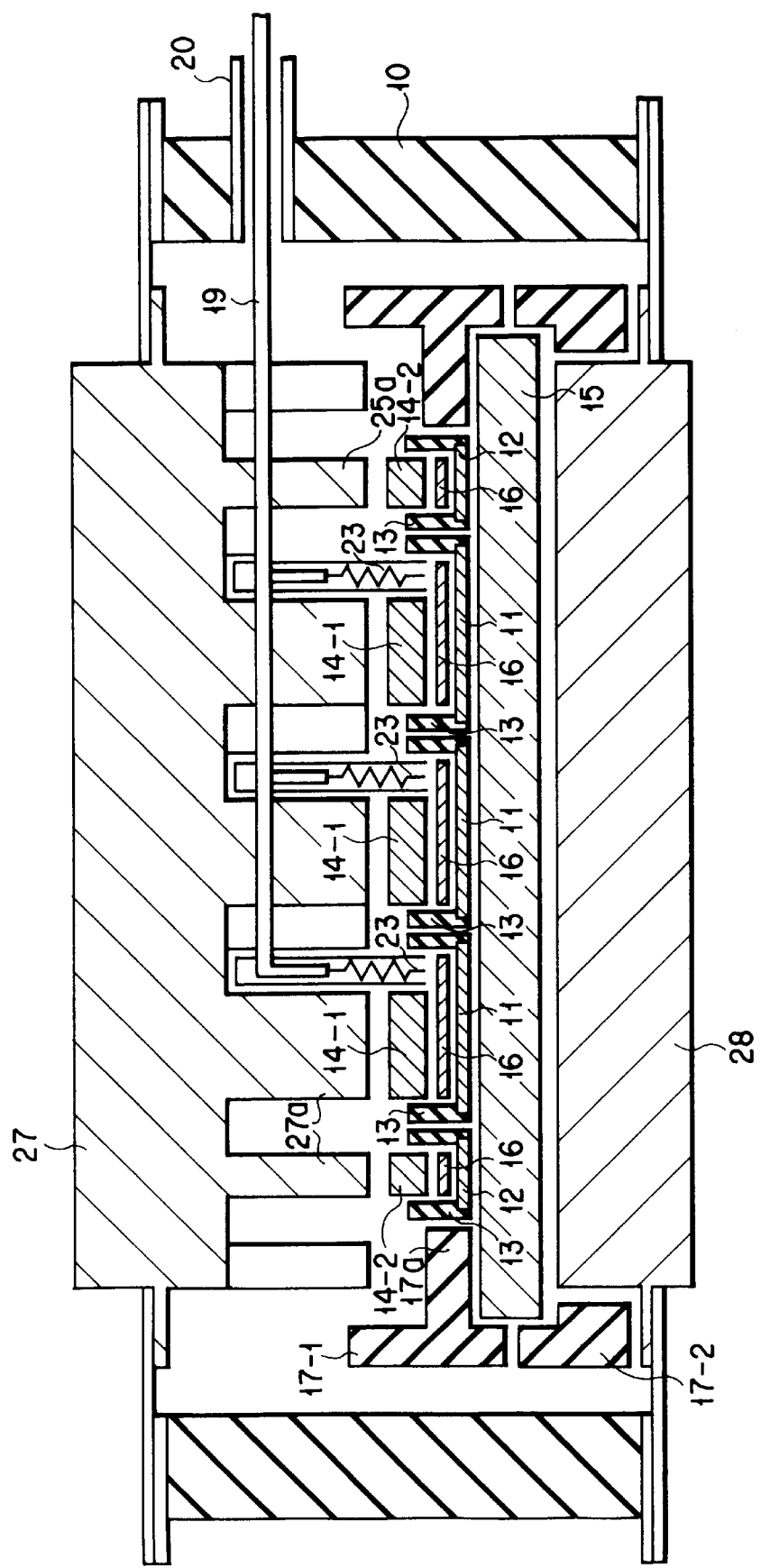
FIG. 5 is a cross sectional view of a press-contact type semiconductor device according to a second embodiment of the invention.

FIG. 5 is a sectional view, showing a press-contact type semiconductor device according to a second embodiment of the invention. As described above, in the first embodiment, heat buffer plates 14-1 and 14-2 of different thicknesses are provided for correcting variations in thickness among the IGBT chips 11 and the FRD chips 12, and also the thickness-correcting member 25 is provided for correcting variations, due to manufacturing variations, in total thickness of each chip and a corresponding heat buffer plate. On the other hand, in the second embodiment, the correcting member 25 is not employed, and variations in thickness among the IGBT chips 11 and the FRD chips 12 are corrected only by changing the thicknesses of the heat buffer plates 14-1 and 14-2 in accordance with the variations. In this case, the emitter press-contact electrode 27 is provided with elongated projections 27a located corresponding to the chips 11 and 12. These projections 27a are brought into press contact with the heat buffer plates 14-1 and 14-2.

In the FIG. 5 structure, variations in thickness among the IGBT chips 11 and the FRD chips 12 can be corrected by the heat buffer plates 14-1 and 14-2. The other advantages of this structure are similar to those of the first embodiment.

Figure 6:
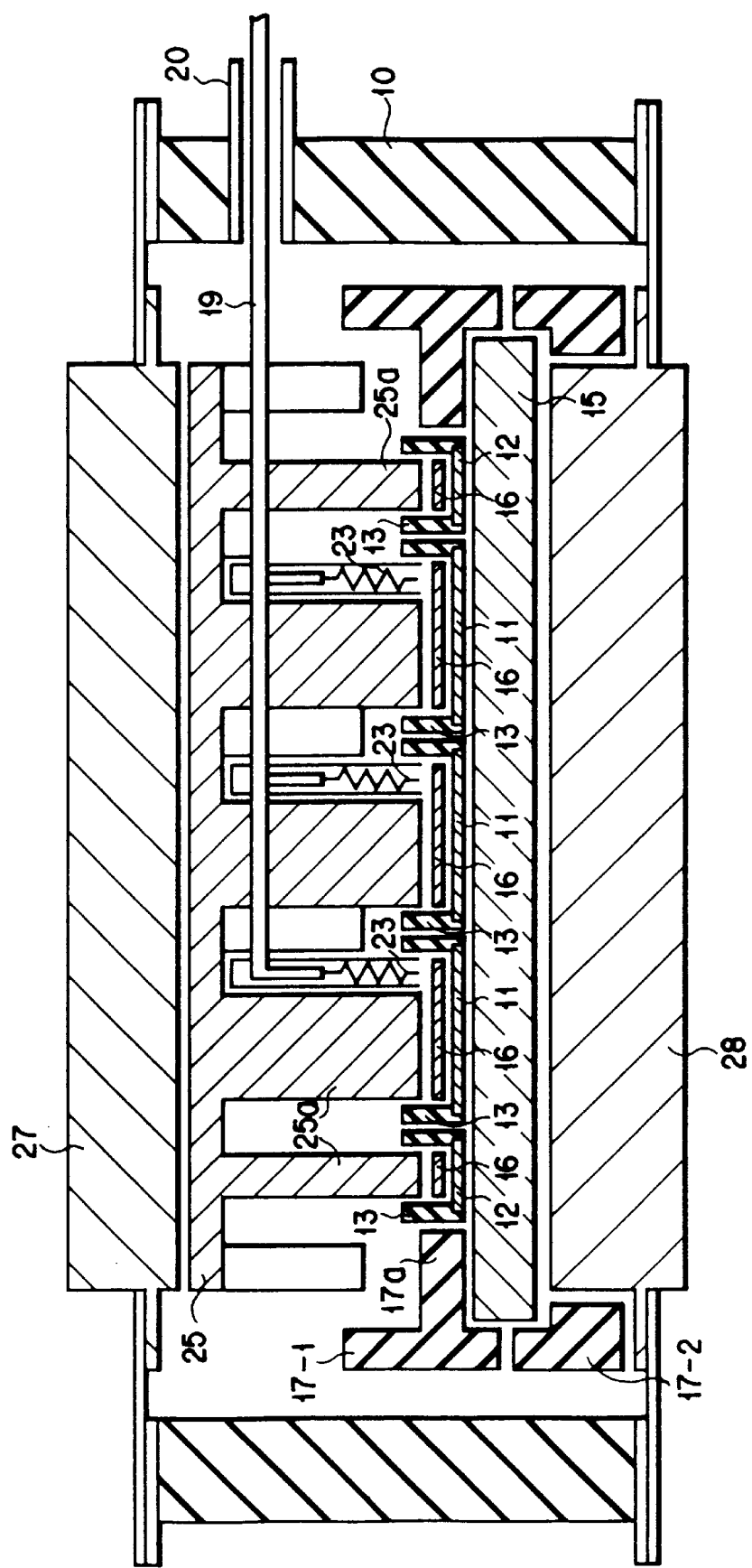
FIG. 6 is a cross sectional view of a press-contact type semiconductor device according to a third embodiment of the invention.

FIG. 6 is a sectional view, showing a press-contact type semiconductor device according to a third embodiment of the invention. In the third embodiment, the heat buffer plates 14-1 and 14-2 are not employed, but the major surfaces of the IGBT chips 11 and the FRD chips 12 are directly brought into press contact with the projections 25a of the thickness-correcting member 25, with the soft-metal foil members 16 interposed therebetween.

The heat buffer plates 14-1 and 14-2 are employed only if they are necessary. Even in the FIG. 6 structure, a pressure, which is higher than that applied during use of the device and can plastically deform the correcting member 25, is applied to the emitter and collector press-contact electrode plates 27 and 28 before the use of the device, thereby deforming the projections 25a of the correcting member 25 and correcting variations in thickness among the chips 11 and 12. As a result, a uniform and optimal load can be applied to each chip, thereby enhancing the reliability of the device and preventing an increase in thermal resistance and on-voltage.

In the third embodiment, it is preferable that the variations in thickness among the IGBT chips 11 and the FRD chips 12 fall within a range of 40 μm or less.

Figure 7:
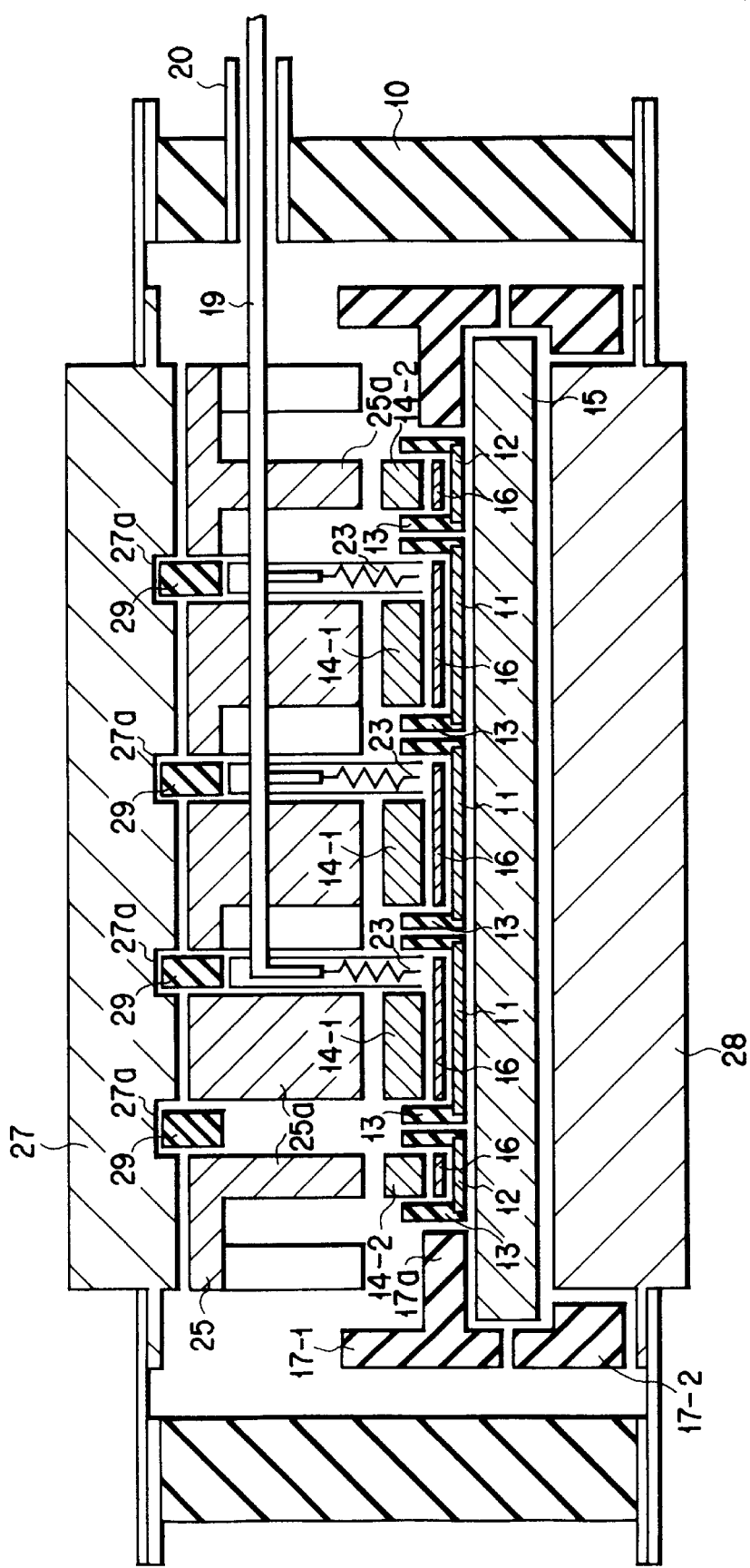
FIG. 7 is a cross sectional view of a press-contact type semiconductor device according to a fourth embodiment of the invention.

FIG. 7 is a sectional view, showing a press-contact type semiconductor device according to a fourth embodiment of the invention. In the fourth embodiment, the thickness-correcting member 25 consists of plural portions. These correcting member portions are fixed by engaging guide members 29, made of insulators such as a resin, with grooves 27a formed in those portions of the emitter press-contact electrode plate 27 which face the correcting member portions.

This structure also provides the same advantages as the first embodiment.

Figure 8:
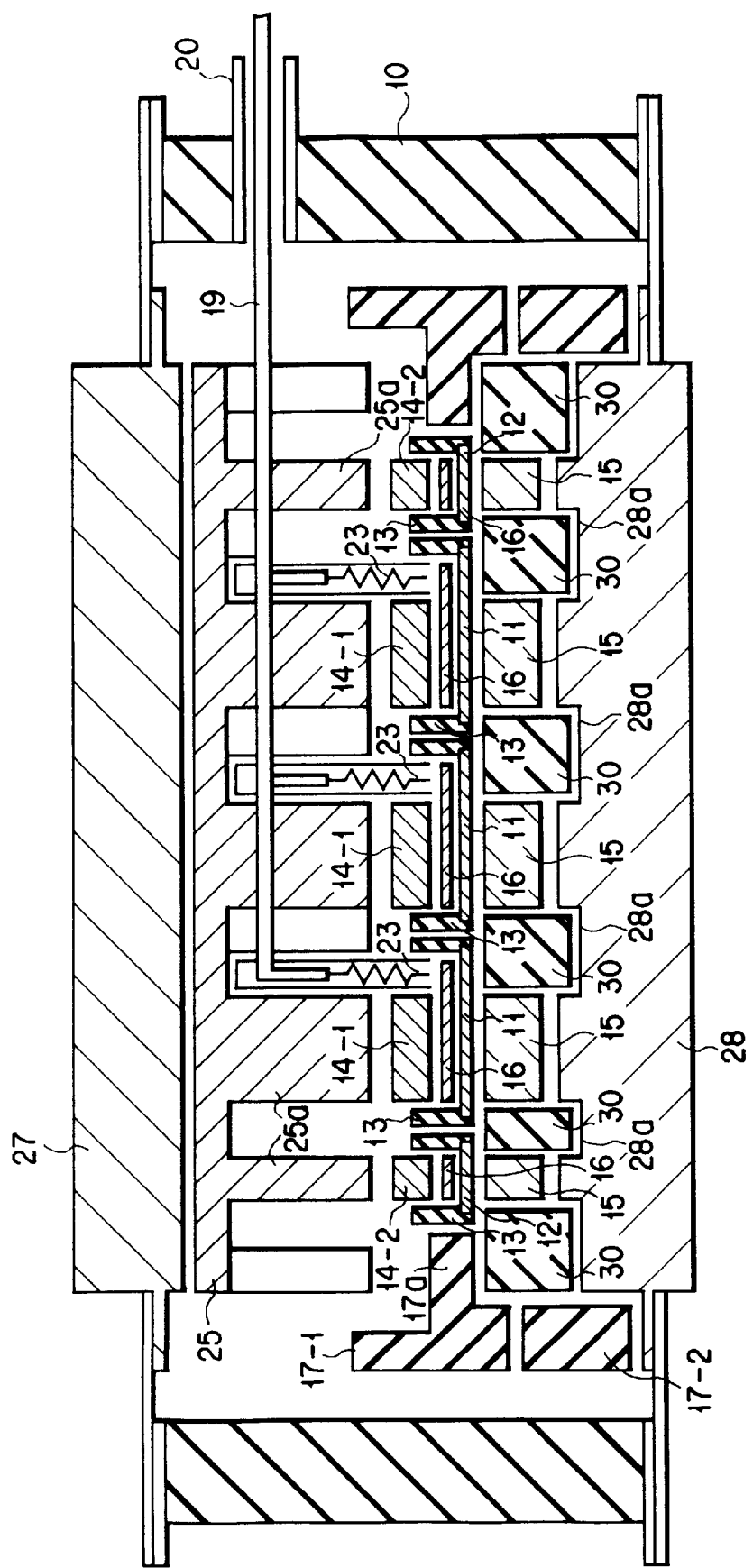
FIG. 8 is a cross sectional view of a press-contact type semiconductor device according to a first embodiment of the invention.

FIG. 8 is a sectional view, showing a press-contact type semiconductor device according to a fifth embodiment of the invention. In the fifth embodiment, a plurality of heat buffer plates 15 obtained by dividing the heat buffer disk plate 15 employed in the first embodiment are provided for the chips 11 and 12, respectively. Each heat buffer plate 15 is fixed by engaging guide members 30, made of insulators such as a resin, with grooves 28a formed in those portions of the collector press-contact electrode plate 28 which face the heat buffer plates 15.

This structure also provides the same advantages as the first embodiment. Moreover, since the IGBT chips 11 and the FRD chips 12 are pressed vertically uniformly, a more uniform and optimal load can be applied to each chip, with the result that the device of the fifth embodiment can have a higher resistance against heat, etc. than the devices of the first through fourth embodiments.

The invention is not limited to the above-described first through fifth embodiments, but may be modified in various manners without departing from the scope. For example, although in the embodiments, the thickness-correcting member 25 is made of full-annealed oxygen-free copper, it may be made of other conductive material such as Ag. Further, the thickness of the member 25 and pressure applied thereto at the time of plastic deformation may be set to other values in accordance with the circumstances. Moreover, the chip frames 13 and the soft-metal foil members 16 are not indispensable elements, but can selectively be omitted in accordance with the circumstances. In addition, although in the first through fifth embodiments, the reverse-conduction press-contact type IGBT is employed as the press-contact type semiconductor device, it is a matter of course that the invention is also applicable to other press-contact type semiconductor devices. Although in the embodiments, two types of semiconductor devices press-contact each other, the invention is also applicable to the case of bringing three or more types of semiconductor devices into press contact with each other.

What is claimed is:

1. A press-contact type semiconductor device comprising:
    a plurality of semiconductor chips located in a single plane, being fixed solderlessly and having different thicknesses;
    a plurality of heat buffer plates located on major surfaces of the semiconductor chips, respectively, the total thickness of one of the heat buffer plates and that one of the semiconductor chips which corresponds to the one heat buffer plate being set substantially the same as the total thickness of any other heat buffer plate and that one of the semiconductor chips which corresponds to the any other heat buffer plate;
    a first press-contact electrode plate having elongated projections extending from surface portions thereof corresponding to the semiconductor chips, to the heat buffer plates, respectively;
    a heat buffer disk plate located on those surfaces of the semiconductor chips which are opposite to the major surfaces; and
    a second press-contact electrode plate located on that surface of the heat buffer disk plate which is remote from the semiconductor chips;
    wherein the first and second press-contact electrode plates are pressed such that the heat buffer plates, the semiconductor chips and the heat buffer disk plate interposed therebetween are brought into press contact with each other, thereby correcting variations in thickness among the semiconductor chips by means of the heat buffer plates.

2. The press-contact type semiconductor device according to claim 1, wherein variations in total thickness of each semiconductor chip and a corresponding one of the heat buffer plates fall within a range of 40 μm or less.

3. The press-contact type semiconductor device according to claim 1, further comprising a soft-metal foil member interposed between each heat buffer plate and the major surface of a corresponding semiconductor chip.

4. The press-contact type semiconductor device according to claim 1, further comprising a chip frame interposed between the major surface of each semiconductor chip and the first press-contact electrode plate for horizontally positioning and fixing the semiconductor chip, the heat buffer plates contacting the major surfaces of the semiconductor chips in the chip frames, respectively.

5. The press-contact type semiconductor device according to claim 1, wherein the semiconductor chips include IGBT chips and FRD chips, and the FRD chips are connected parallel to the IGBT chips such that the current-flow direction of the FRD chips is opposite to that of the IGBT chips.

6. A press-contact type semiconductor device comprising:
    a plurality of semiconductor chips located in a single plane and being fixed solderlessly;
    a plurality of heat buffer plates located on major surfaces of the semiconductor chips, respectively;
    a thickness-correcting member having elongated projections extending from surface portions thereof corresponding to the semiconductor chips, to the major surfaces of the semiconductor chips, respectively;
    a heat buffer disk plate located on those surfaces of the semiconductor chips which are opposite to the major surfaces; and
    first and second press-contact electrode plates, to which a force of press is applied such that the thickness-correcting member, the heat buffer plates, the semiconductor chips and the heat buffer disk plate, which are interposed between the electrode plates, are brought into press contact with each other;
    wherein the thickness-correcting member has its elongated projections deformed when a force of press, which is higher than that applied at the time of using the device and can plastically deform the thickness-correcting member, is applied to the first and second press-contact electrode plates, thereby correcting variations in total thickness of each semiconductor chip and a corresponding one of the heat buffer plates.

7. The press-contact type semiconductor device according to claim 6, wherein the thickness-correcting member is made of copper, and the variations in total thickness of each semiconductor chip and a corresponding one of the heat buffer plates fall within a range of 40 μm or less.

8. The press-contact type semiconductor device according to claim 6, further comprising a soft-metal foil member interposed between each heat buffer plate and the major surface of a corresponding semiconductor chip.

9. The press-contact type semiconductor device according to claim 6, further comprising a chip frame interposed between the major surface of each semiconductor chip and the thickness-correcting member for horizontally positioning and fixing the semiconductor chip, the heat buffer plates contacting the major surfaces of the semiconductor chips in the chip frames, respectively.

10. The press-contact type semiconductor device according to claim 6, wherein the semiconductor chips include IGBT chips and FRD chips, and the FRD chips are connected parallel to the IGBT chips such that the current-flow direction of the FRD chips is opposite to that of the IGBT chips.

11. A press-contact type semiconductor device comprising:
- a plurality of semiconductor chips located in a single plane being fixed solderlessly and having different thicknesses;
- a plurality of heat buffer plates located on major surfaces of the semiconductor chips, respectively, the total thickness of one of the heat buffer plates and that one of the semiconductor chips which corresponds to the one heat buffer plate being set substantially the same as the total thickness of any other heat buffer plate and that one of the semiconductor chips which corresponds to the any other heat buffer plate;
- a thickness-correcting member located on the heat buffer plates and having elongated projections projecting from surface portions thereof corresponding to the semiconductor chips toward the semiconductor chips, respectively;
- a heat buffer disk plate located on those surfaces of the semiconductor chips which are opposite to the major surfaces; and
- first and second press-contact electrode plates, to which a force of press is applied such that the thickness-correcting member, the heat buffer plates, the semiconductor chips and the heat buffer disk plate, which are interposed between the electrode plates, are brought into press contact with each other;
- wherein variations in thickness among the semiconductor chips are corrected by the heat buffer plates, and the thickness-correcting member has its elongated projections deformed when a force of press, which is higher than that applied at the time of using the device and can plastically deform the thickness-correcting member, is applied to the first and second press-contact electrode plates, thereby correcting variations in total thickness of each semiconductor chip and a corresponding one of the heat buffer plates.

12. The press-contact type semiconductor device according to claim 11, wherein the thickness-correcting member is made of copper, and the variations in total thickness of each semiconductor chip and a corresponding one of the heat buffer plates fall within a range of 40 $\mu$m or less.

13. The press-contact type semiconductor device according to claim 11, further comprising a soft-metal foil member interposed between each heat buffer plate and the major surface of a corresponding semiconductor chip.

14. The press-contact type semiconductor device according to claim 11, further comprising a chip frame interposed between the major surface of each semiconductor chip and the thickness-correcting member for horizontally positioning and fixing the semiconductor chip, the heat buffer plates contacting the major surfaces of the semiconductor chips in the chip frames, respectively.

15. The press-contact type semiconductor device according to claim 11, wherein the semiconductor chips include IGBT chips and FRD chips, and the FRD chips are connected parallel to the IGBT chips such that the current-flow direction of the FRD chips is opposite to that of the IGBT chips.

16. A press-contact type semiconductor device comprising:
- a plurality of first semiconductor chips located in a single plane and being fixed solderlessly;
- a plurality of second semiconductor chips located in the same plane as the first semiconductor chips, being fixed solderlessly and having a difference thickness from that of the first semiconductor chips;
- a plurality of first heat buffer plates located on major surfaces of the first semiconductor chips, respectively;
- a plurality of second heat buffer plates located on major surfaces of the second semiconductor chips, respectively, the total thickness of each of the second heat buffer plates and a corresponding one of the second semiconductor chips being set substantially the same as the total thickness of each of the first heat buffer plates and a corresponding one of the first semiconductor chips;
- a first press-contact electrode plate having elongated projections extending from surface portions thereof corresponding to the first and second semiconductor chips, to the first and second heat buffer plates, respectively;
- a heat buffer disk plate located on those surfaces of the first and second semiconductor chips which are opposite to the major surfaces; and
- a second press-contact electrode plate located on that surface of the heat buffer disk plate which is remote from the first and second semiconductor chips;
- wherein the first and second press-contact electrode plates are pressed such that the first and second heat buffer plates, the first and second semiconductor chips and the heat buffer disk plate, which are interposed between the electrode plates, are brought into press contact with each other, thereby correcting the differences in thickness between the first and second semiconductor chips by means of the first and second heat buffer plates.

17. The press-contact type semiconductor device according to claim 16, wherein the difference between the total thickness of each of the first semiconductor chips and a corresponding one of the first heat buffer plates, and the total thickness of each of the second semiconductor chips and a corresponding one of the second heat buffer plates is less than 40 $\mu$m.

18. The press-contact type semiconductor device according to claim 16, further comprising a soft-metal foil member interposed between each of the first and second heat buffer plates and the major surface of a corresponding one of the first and second semiconductor chips.

19. The press-contact type semiconductor device according to claim 16, further comprising a chip frame interposed between the major surface of each of the first and second semiconductor chips and the first press-contact electrode plate, for horizontally positioning and fixing the first and second semiconductor chips, the first and second heat buffer plates contacting the major surfaces of the first and second semiconductor chips in the chip frames, respectively.

20. The press-contact type semiconductor device according to claim 16, wherein the first semiconductor chips are IGBT chips and the second semiconductor chips are FRD chips, the FRD chips being connected parallel to the IGBT chips such that the current-flow direction of the FRD chips is opposite to that of the IGBT chips.

21. A press-contact type semiconductor device comprising:
- a plurality of first semiconductor chips located in a single plane and being fixed solderlessly;
- a plurality of second semiconductor chips located in the same plane as the first semiconductor chips, being fixed solderlessly and having a difference thickness from that of the first semiconductor chips;
- a plurality of first heat buffer plates located on major surfaces of the first semiconductor chips, respectively;
- a plurality of second heat buffer plates located on major surfaces of the second semiconductor chips, respectively;

a thickness-correcting member having elongated projections extending from surface portions thereof corresponding to the first and second semiconductor chips, to the first and second heat buffer plates, respectively;

a heat buffer disk plate located on those surfaces of the first and second semiconductor chips which are opposite to the major surfaces; and first and second press-contact electrode plates, to which a force of press is applied such that the thickness-correcting member, the first and second heat buffer plates, the first and second semiconductor chips and the heat buffer disk plate, which are interposed between the electrode plates, are brought into press contact with each other;

wherein the thickness-correcting member has its elongated projections deformed when a force of press, which is higher than that applied at the time of using the device and can plastically deform the thickness-correcting member, is applied to the first and second press-contact electrode plates, thereby correcting variations in total thickness of each of the first and second semiconductor chips and a corresponding one of the first and second heat buffer plates.

22. The press-contact type semiconductor device according to claim 21, wherein the thickness-correcting member is made of copper, and the difference between the total thickness of each of the first semiconductor chips and a corresponding one of the first heat buffer plates, and the total thickness of each of the second semiconductor chips and a corresponding one of the second heat buffer plates is less than 40 $\mu$m.

23. The press-contact type semiconductor device according to claim 21, further comprising a soft-metal foil member interposed between each of the first and second heat buffer plates and the major surface of a corresponding one of the first and second semiconductor chips.

24. The press-contact type semiconductor device according to claim 21, further comprising a chip frame interposed between the major surface of each of the first and second semiconductor chips and the thickness-correcting member, for horizontally positioning and fixing the first and second semiconductor chips, the first and second heat buffer plates contacting the major surfaces of the first and second semiconductor chips in the chip frames, respectively.

25. The press-contact type semiconductor device according to claim 21, wherein the first semiconductor chips are IGBT chips and the second semiconductor chips are FRD chips, the FRD chips being connected parallel to the IGBT chips such that the current-flow direction of the FRD chips is opposite to that of the IGBT chips.

26. A press-contact type semiconductor device comprising:

a plurality of first semiconductor chips located in a single plane and being fixed solderlessly;

a plurality of second semiconductor chips located in the same plane as the first semiconductor chips, being fixed solderlessly and having a difference thickness from that of the first semiconductor chips;

a plurality of first heat buffer plates located on major surfaces of the first semiconductor chips, respectively;

a plurality of second heat buffer plates located on major surfaces of the second semiconductor chips, respectively;

the total thickness of each of the second heat buffer plates and a corresponding one of the second semiconductor chips being set substantially the same as the total thickness of each of the first heat buffer plates and a corresponding one of the first semiconductor chips;

a thickness-correcting member having elongated projections extending from surface portions thereof corresponding to the first and second semiconductor chips, to the first and second heat buffer plates, respectively;

a heat buffer disk plate located on those surfaces of the first and second semiconductor chips which are opposite to the major surfaces; and first and second press-contact electrode plates, to which a force of press is applied such that the thickness-correcting member, the first and second heat buffer plates, the first and second semiconductor chips and the heat buffer disk plate, which are interposed between the electrode plates, are brought into press contact with each other;

wherein the difference in thickness between the first and second semiconductor chips is corrected using the first and second heat buffer plates, and the thickness-correcting member has its elongated projections deformed when a force of press, which is higher than that applied at the time of using the device and can plastically deform the thickness-correcting member, is applied to the first and second press-contact electrode plates, thereby correcting variations in total thickness of each of the first and second semiconductor chips and a corresponding one of the first and second heat buffer plates.

27. The press-contact type semiconductor device according to claim 26, wherein the thickness-correcting member is made of copper, and the difference between the total thickness of each of the first semiconductor chips and a corresponding one of the first heat buffer plates, and the total thickness of each of the second semiconductor chips and a corresponding one of the second heat buffer plates is less than 40 $\mu$m.

28. The press-contact type semiconductor device according to claim 26, further comprising a soft-metal foil member interposed between each of the first and second heat buffer plates and the major surface of a corresponding one of the first and second semiconductor chips.

29. The press-contact type semiconductor device according to claim 26, further comprising a chip frame interposed between the major surface of each of the first and second semiconductor chips and the thickness-correcting member, for horizontally positioning and fixing the first and second semiconductor chips, the first and second heat buffer plates contacting the major surfaces of the first and second semiconductor chips in the chip frames, respectively.

30. The press-contact type semiconductor device according to claim 26, wherein the first semiconductor chips are IGBT chips and the second semiconductor chips are FRD chips, the FRD chips being connected parallel to the IGBT chips such that the current-flow direction of the FRD chips is opposite to that of the IGBT chips.

31. A press-contact type semiconductor device comprising:

a plurality of semiconductor chips located in a single plane and being fixed solderlessly;

a thickness-correcting member having elongated projections extending from surface portions thereof corresponding to the semiconductor chips, to the major surfaces of the semiconductor chips, respectively;

a heat buffer disk plate located on those surfaces of the semiconductor chips which are opposite to the major surfaces; and first and second press-contact electrode plates, to which a force of press is applied such that the thickness-correcting member, the semiconductor chips and the heat buffer disk plate, which are interposed between the electrode plates, are brought into press contact with each other;

wherein the thickness-correcting member has its elongated projections deformed when a force of press, which is higher than that applied at the time of using the device and can plastically deform the thickness-correcting member, is applied to the first and second press-contact electrode plates, thereby correcting variations in thickness among the semiconductor chips.

32. The press-contact type semiconductor device according to claim 31, wherein the thickness-correcting member is made of copper, and the variations in thickness among the semiconductor chips fall within a range of 40 $\mu$m or less.

33. The press-contact type semiconductor device according to claim 31, further comprising a chip frame interposed between the major surface of each of the semiconductor chips and the thickness-correcting member for horizontally positioning and fixing the semiconductor chips.

34. The press-contact type semiconductor device according to claim 31, wherein the semiconductor chips include IGBT chips and FRD chips, and the FRD chips are connected parallel to the IGBT chips such that the current-flow direction of the FRD chips is opposite to that of the IGBT chips.

35. A press-contact type semiconductor device comprising:

a plurality of first semiconductor chips located in a single plane and being fixed solderlessly;

a plurality of second semiconductor chips located in the same plane as the first semiconductor chips, being fixed solderlessly and having a difference thickness from that of the first semiconductor chips;

a thickness-correcting member having elongated projections extending from surface portions thereof corresponding to the first and second semiconductor chips, to the major surfaces of the first and second semiconductor chips, respectively;

a heat buffer disk plate located on those surfaces of the first and second semiconductor chips which are opposite to the major surfaces; and first and second press-contact electrode plates, to which a force of press is applied such that the thickness-correcting member, the semiconductor chips and the heat butter disk plate, which are interposed between the electrode plates, are brought into press contact with each other;

wherein the thickness-correcting member has its elongated projections deformed when a force of press, which is higher than that applied at the time of using the device and can plastically deform the thickness-correcting member, is applied to the first and second press-contact electrode plates, thereby correcting variations in thickness among the first and second semiconductor chips.

36. The press-contact type semiconductor device according to claim 35, wherein the thickness-correcting member is made of copper, and the variations in thickness among the first and second semiconductor chips fall within a range of 40 $\mu$m or less.

37. The press-contact type semiconductor device according to claim 35, further comprising a chip frame interposed between the major surface of each of the first and second semiconductor chips and the thickness-correcting member for horizontally positioning and fixing the first and second semiconductor chips.

38. The press-contact type semiconductor device according to claim 35, wherein the first semiconductor chips are IGBT chips and the second semiconductor chips are FRD chips, the FRD chips being connected parallel to the IGBT chips such that the current-flow direction of the FRD chips is opposite to that of the IGBT chips.

39. A press-contact type semiconductor device comprising:

a plurality of semiconductor chips located in a single plane and being fixed solderlessly;

a plurality of heat buffer plates located on major surfaces of the semiconductor chips, respectively;

a thickness-correcting member located on the heat buffer plates for correcting variations in total thickness of each of the semiconductor chips and a corresponding one of the heat buffer plates;

a heat buffer disk plate located on those surfaces of the semiconductor chips which are opposite to the major surfaces; and first and second press-contact electrode plates, to which a force of press is applied such that the thickness-correcting member, the heat buffer plates, the semiconductor chips and the heat buffer disk plate, which are interposed between the electrode plates, are brought into press contact with each other;

wherein the thickness-correcting member is deformed when a force of press, which is higher than that applied at the time of using the device and can plastically deform the thickness-correcting member, is applied to the first and second press-contact electrode plates, thereby correcting the variations in total thickness of each semiconductor chip and a corresponding one of the heat buffer plates.

40. The press-contact type semiconductor device according to claim 39, wherein the variations in total thickness of each of the semiconductor chips and a corresponding one of the heat buffer plates fall within a range of 40 $\mu$m or less.

41. The press-contact type semiconductor device according to claim 39, further comprising a soft-metal foil member interposed between each of the heat buffer plates and the major surface of a corresponding one of the semiconductor chips.

42. The press-contact type semiconductor device according to claim 39, further comprising a chip frame interposed between the major surface of each of the semiconductor chips and the thickness-correcting member for horizontally positioning and fixing the semiconductor chips, the heat buffer plates contacting the major surfaces of the semiconductor chips in the chip frames, respectively.

43. The press-contact type semiconductor device according to claim 39, wherein the semiconductor chips include IGBT chips and FRD chips, and the FRD chips are connected parallel to the IGBT chips such that the current-flow direction of the FRD chips is opposite to that of the IGBT chips.

44. A press-contact type semiconductor device comprising:

a plurality of first semiconductor chips located in a single plane and being fixed solderlessly;

a plurality of second semiconductor chips located in the same plane as the first semiconductor chips, being fixed solderlessly and having a different thickness from that of the first semiconductor chips;

a plurality of first heat buffer plates located on major surfaces of the first semiconductor chips, respectively;

a plurality of second heat buffer plates located on major surfaces of the second semiconductor chips, respectively;

a plurality of thickness-correcting members each of which are located on the first and second heat buffer plates for correcting variations in the sum of each of the first semiconductor chips and a corresponding one of the first heat buffer plates, and variations in the sum of each of the second semiconductor chips and a corresponding one of the second heat buffer plates;

a heat buffer disk plate located on those surfaces of the first and second semiconductor chips which are opposite to the major surfaces; and first and second press-contact electrode plates, to which a force of press is applied such that the thickness-correcting members, the first and second heat buffer plates, the first and second semiconductor chips and the heat buffer disk plate, which are interposed between the electrode plates, are brought into press contact with each other;

wherein the thickness-correcting members are deformed according to variations in total thickness of each of the first and second semiconductor chips and a corresponding one of the first and second heat buffer plates, when a force of press, which is higher than that applied at the time of using the device and can plastically deform the thickness-correcting members, is applied to the first and second press-contact electrode plates, thereby correcting the variations in total thickness of each of the first and second semiconductor chips and a corresponding one of the first and second heat buffer plates.

45. The press-contact type semiconductor device according to claim 44, wherein the thickness-correcting member is made of copper, and the difference between the total thickness of each of the first semiconductor chips and a corresponding one of the first heat buffer plates, and the total thickness of each of the second semiconductor chips and a corresponding one of the second heat buffer plates is less than 40 μm.

46. The press-contact type semiconductor device according to claim 44, further comprising a soft-metal foil member interposed between each of the first and second heat buffer plates and the major surface of a corresponding one of the first and second semiconductor chips.

47. The press-contact type semiconductor device according to claim 44, further comprising a chip frame interposed between the major surface of each of the first and second semiconductor chips and the thickness-correcting member, for horizontally positioning and fixing the first and second semiconductor chips, the first and second heat buffer plates contacting the major surfaces of the first and second semiconductor chips in the chip frames, respectively.

48. The press-contact type semiconductor device according to claim 44, wherein the first semiconductor chips are IGBT chips and the second semiconductor chips are FRD chips, the FRD chips being connected parallel to the IGBT chips such that the current-flow direction of the FRD chips is opposite to that of the IGBT chips.

49. A press-contact type semiconductor device comprising:

a plurality of semiconductor chips located in a single plane and being fixed solderlessly;

a plurality of first heat buffer plates located on major surfaces of the first semiconductor chips, respectively;

a thickness-correcting member located on the first heat buffer plates for correcting variations in the sum of each of the semiconductor chips and a corresponding one of the first heat buffer plates;

a plurality of second heat buffer plates located on those surfaces of the semiconductor chips which are opposite to the major surfaces, respectively; and first and second press-contact electrode plates, to which a force of press is applied such that the thickness-correcting member, the first heat buffer plates, the semiconductor chips and the second heat buffer plates, which are interposed between the electrode plates, are brought into press contact with each other;

wherein the thickness-correcting member is deformed when a force of press, which is higher than that applied at the time of using the device and can plastically deform the thickness-correcting member, is applied to the first and second press-contact electrode plates, thereby correcting the variations in total thickness of each of the semiconductor chips and a corresponding one of the first heat buffer plates.

50. The press-contact type semiconductor device according to claim 49, wherein the thickness-correcting member is made of copper, and the variations in total thickness of each of the semiconductor chips and a corresponding one of the first heat buffer plates fall within a range of 40 μm or less.

51. The press-contact type semiconductor device according to claim 49, further comprising a soft-metal foil member interposed between each of the first heat buffer plates and the major surface of a corresponding one of the semiconductor chips.

52. The press-contact type semiconductor device according to claim 49, further comprising a chip frame interposed between the major surface of each of the semiconductor chips and the thickness-correcting member, for horizontally positioning and fixing the first and second semiconductor chips, the first heat buffer plates contacting the major surfaces of the semiconductor chips in the chip frames, respectively.

53. The press-contact type semiconductor device according to claim 49, wherein the semiconductor chips include IGBT chips and FRD chips, and the FRD chips are connected parallel to the IGBT chips such that the current-flow direction of the FRD chips is opposite to that of the IGBT chips.

54. The press-contact type semiconductor device according to claim 49, further comprising guide members fixing the second heat buffer plates.

55. A press-contact type semiconductor device comprising:

a plurality of first semiconductor chips located in a single plane and being fixed solderlessly;

a plurality of second semiconductor chips located in the same plane as the first semiconductor chips, being fixed solderlessly and having a difference thickness from that of the first semiconductor chips;

a plurality of first heat buffer plates located on major surfaces of the first semiconductor chips, respectively;

a plurality of second heat buffer plates located on major surfaces of the second semiconductor chips, respectively;

a thickness correcting member located on the first and second heat buffer plates for correcting variations in total thickness of each of the first and second semiconductor chips and a corresponding one of the first and second heat buffer plates;

a plurality of third heat buffer plates located on those surfaces of the first semiconductor chips which are opposite to the major surfaces;

a plurality of fourth heat buffer plates located on those surfaces of the second semiconductor chips which are opposite to the major surfaces; and first and second press-contact electrode plates, to which a force of press is applied such that the thickness-correcting member, the first and second heat buffer plates, the first and second semiconductor chips and the third and fourth heat buffer plates, which are interposed between the electrode plates, are brought into press contact with each other;

wherein the thickness-correcting member has its elongated projections deformed when a force of press, which is higher than that applied at the time of using the device and can plastically deform the thickness-correcting member, is applied to the first and second press-contact electrode plates, thereby correcting the variations in total thickness of each of the first and second semiconductor chips and a corresponding one of the first and second heat buffer plates.

56. The press-contact type semiconductor device according to claim 55, wherein the thickness-correcting member is made of copper, and the variations in total thickness of each of the first and second semiconductor chips and a corresponding one of the first and second heat buffer plates fall within a range of 40 $\mu$m or less.

57. The press-contact type semiconductor device according to claim 55, further comprising a soft-metal foil member interposed between each of the first and second heat buffer plates and the major surface of a corresponding one of the first and second semiconductor chips.

58. The press-contact type semiconductor device according to claim 55, further comprising a chip frame interposed between the major surface of each of the first and second semiconductor chips and the thickness-correcting member, for horizontally positioning and fixing the first and second semiconductor chips, the first and second heat buffer plates contacting the major surfaces of the first and second semiconductor chips in the chip frames, respectively.

59. The press-contact type semiconductor device according to claim 55, wherein the first semiconductor chips are IGBT chips and the second semiconductor chips are FRD chips, the FRD chips being connected parallel to the IGBT chips such that the current-flow direction of the FRD chips is opposite to that of the IGBT chips.

60. The press-contact type semiconductor device according to claim 55, further comprising guide members fixing the third and fourth heat buffer plates.

* * * * *